(12) United States Patent
Fishkin et al.

(10) Patent No.: US 7,252,098 B2
(45) Date of Patent: Aug. 7, 2007

(54) APPARATUS FOR CLEANING AND DRYING SUBSTRATES

(75) Inventors: Boris Fishkin, San Carlos, CA (US); Michael Sherrard, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 16 days.

(21) Appl. No.: 10/667,855

(22) Filed: Sep. 22, 2003

(65) Prior Publication Data

US 2004/0055625 A1  Mar. 25, 2004

Related U.S. Application Data

(60) Division of application No. 10/046,423, filed on Oct. 25, 2001, now Pat. No. 6,746,544, which is a continuation of application No. 09/280,118, filed on Mar. 26, 1999, now Pat. No. 6,328,814.

(51) Int. Cl.
  *B08B 7/04*  (2006.01)
  *B08B 3/04*  (2006.01)
  *B08B 3/10*  (2006.01)

(52) U.S. Cl. .................... 134/66; 134/61; 134/184; 134/902

(58) Field of Classification Search ................ 134/902, 134/61, 76, 66, 1.3, 26, 30, 32, 37, 184
See application file for complete search history.

(56) References Cited

U.S. PATENT DOCUMENTS 3,868,272 A  2/1975 Tardoskegyi (Continued)

FOREIGN PATENT DOCUMENTS

EP  0 385 536  9/1990
JP  10189528  7/1998

OTHER PUBLICATIONS

Solid State Technology, "A moving-zone Marangoni drying process for critical cleaning and wet processing", Jerald A. Britten, pp. 143-148, Oct. 1997.

(Continued)

*Primary Examiner*—Alexander Markoff
(74) *Attorney, Agent, or Firm*—Dugan & Dugan

(57) ABSTRACT

A method and apparatus for cleaning, rinsing and Marangoni drying substrates is provided. A line of fluid is sprayed along a substrate surface forming an air/fluid interface line, and a line of drying vapor is supplied to the interface line to achieve Marangoni drying. Thus, a large portion of the substrate is simultaneously dried. A preferred apparatus employs a tank of cleaning and/or rinsing fluid. Above the tank fluid a source of rinsing fluid directs rinsing fluid to the surface of a substrate forming a meniscus on the substrate surface as the substrate is lifted from the cleaning fluid, and a drying vapor source directs drying vapor to the meniscus. The drying vapor lowers the surface tension of the meniscus, inducing a Marangoni flow of rinsing fluid from the substrate's surface, and thereby drying the substrate. The cleaning fluid tank has a substrate receiving and cleaning portion and a substrate rinsing portion. The rinsing fluid source and the drying vapor source are enclosed by a drying enclosure above the rinsing portion of the tank. Thus, substrate loading, cleaning, rinsing, drying and unloading are performed with at least partial overlap in time.

15 Claims, 7 Drawing Sheets

U.S. PATENT DOCUMENTS

| | | | |
|---|---|---|---|
| 4,911,761 A | 3/1990 | McConnell et al. | |
| 4,977,688 A | 12/1990 | Roberson, Jr. et al. | |
| 4,984,597 A | 1/1991 | McConnell et al. | |
| 5,045,120 A * | 9/1991 | Mittag et al. | 134/26 |
| 5,115,576 A | 5/1992 | Roberson, Jr. et al. | |
| 5,205,303 A * | 4/1993 | Gileta | 134/73 |
| 5,271,774 A | 12/1993 | Leenaars et al. | |
| 5,315,766 A | 5/1994 | Roberson, Jr. et al. | |
| 5,368,649 A | 11/1994 | Tzukazaki | |
| 5,571,337 A | 11/1996 | Mohindra et al. | |
| 5,593,505 A | 1/1997 | Erk et al. | |
| 5,660,642 A | 8/1997 | Britten | |
| 5,762,749 A | 6/1998 | Suzuki et al. | |
| 5,772,784 A | 6/1998 | Mohindra et al. | |
| 5,884,640 A | 3/1999 | Fishkin et al. | |
| 5,913,981 A | 6/1999 | Florez | |
| 5,928,432 A * | 7/1999 | Foederl et al. | 134/2 |
| 6,119,706 A * | 9/2000 | Foederl et al. | 134/76 |
| 6,217,665 B1 * | 4/2001 | Suzuki | 134/1 |
| 6,311,702 B1 | 11/2001 | Fishkin | |
| 6,328,814 B1 * | 12/2001 | Fishkin et al. | 134/30 |
| 6,350,322 B1 * | 2/2002 | Yates | 134/3 |
| 6,391,117 B2 * | 5/2002 | Suzuki | 134/1 |
| 6,746,544 B2 * | 6/2004 | Fishkin et al. | 134/30 |
| 6,962,007 B1 | 11/2005 | Maeda et al. | |
| 2001/0004898 A1 | 6/2001 | Kamikawa et al. | |

OTHER PUBLICATIONS

Steag MicroTech, Poseidon Single Tank Tool, The New Powerful Single Bath Processor.

Semiconductor International, "Megasonic Cleaning—Acoustic streaming is delivered to small particles to maximize particle removal", A.A. Busnaina and F.Dai, pp. 85-89, Aug. 1997.

* cited by examiner

APPARATUS FOR CLEANING AND DRYING SUBSTRATES

This application is a division of U.S. patent application Ser. No. 10/046,423, filed Oct. 25, 2001 now U.S. Pat. No. 6,746,544, which is a continuation of U.S. patent application Ser. No. 09/280,118, filed Mar. 26, 1999 now U.S. Pat. No. 6,328,814 both of these patent applications are hereby incorporated by reference herein in their entirety.

FIELD OF THE INVENTION

The present invention relates to processes for simultaneously rinsing and drying substrates. More particularly, the present invention relates to an ultra clean process and apparatus for simultaneously rinsing and Marangoni drying a semiconductor substrate.

BACKGROUND OF THE INVENTION

As semiconductor device geometries continue to decrease, the importance of ultra clean processing increases. Aqueous cleaning within a tank of fluid (or a bath) followed by a rinsing bath (e.g., within a separate tank, or by replacing the cleaning tank fluid) achieves desirable cleaning levels. After removal from the rinsing bath, absent use of a drying apparatus, the bath fluid would evaporate from the substrate's surface causing streaking, spotting and/or leaving bath residue on the surface of the substrate. Such streaking, spotting and residue can cause subsequent device failure. Accordingly, much attention has been directed to improved methods for drying a substrate as it is removed from an aqueous bath.

A method known as Marangoni drying creates a surface tension gradient to induce bath fluid to flow from the substrate in a manner that leaves the substrate virtually free of bath fluid, and thus avoids streaking, spotting and residue marks. Marangoni drying uses relatively small amounts of IPA. Specifically, during Marangoni drying a solvent miscible with the bath fluid is introduced to a fluid meniscus which forms as the substrate is lifted from the bath or as the bath fluid is drained past the substrate. The solvent vapor is absorbed along the surface of the fluid, with the concentration of the absorbed vapor being higher at the tip of the meniscus. The higher concentration of absorbed vapor causes surface tension to be lower at the tip of the meniscus than in the bulk of the bath fluid, causing bath fluid to flow from the drying meniscus toward the bulk bath fluid. Such a flow is known as a "Marangoni" flow, and can be employed to achieve substrate drying without leaving streaks, spotting or bath residue on the substrate.

A conventional Marangoni drying system is disclosed in European Application number 0 385 536 A1, titled "Method and Arrangement for Drying Substrates After Treatment In a Liquid." The '536 System submerges a substrate in a fluid bath. A vapor (e.g., an alcohol vapor) miscible with the bath fluid is mixed with a carrier gas and then passed over the surface of the fluid bath via a plurality of nozzles. The vapor mixes with the fluid bath along the surface thereof, lowering the surface tension of the fluid bath. A fluid meniscus forms along the air/liquid/substrate interface as a substrate is lifted from the fluid bath. This meniscus is formed from the surface layer, and thus has a lower surface tension than does the bulk bath fluid. Accordingly, fluid flows from the surface of the substrate to the bulk bath fluid, leaving a dry substrate surface. Although apparatuses such as that disclosed in the '536 Application effectively remove fluid from the substrate, they consume a considerable amount of fluid because the bath fluid cannot be filtered and recirculated to remove drying vapor therefrom. Thus, the bath fluid must be replaced frequently to maintain a sufficient surface tension gradient at the drying meniscus. Further, considerable time is required to transfer a substrate from the cleaning to the rinsing bath, or to replace bath fluid.

Accordingly, a need exists for an improved method and apparatus that quickly and effectively cleans, rinses and dries a substrate, eliminating not only streaks, spotting and bath residue marks, but also conserving rinsing fluid consumption and reducing the overall time required for the cleaning, rinsing and drying process.

SUMMARY OF THE INVENTION

The present invention provides a method and apparatus for simultaneously bath cleaning, rinsing and Marangoni drying a substrate. The invention is advantageously designed to increase system throughput and reduce fluid consumption. The invention comprises an apparatus for drying a substrate, the apparatus comprising:

a first linear nozzle (i.e., a nozzle having an elongated aperture capable of spraying a line of fluid so as to wet a relatively large portion of the substrate, as compared to a single standard nozzle);

a fluid supply coupled to the first linear nozzle;

a second linear nozzle positioned proximate the first nozzle such that drying vapors therefrom affect the fluid sprayed from the first linear nozzle to create a Marangoni drying effect;

a drying vapor source coupled to the second linear nozzle; and a mechanism for passing the substrate past the first and second linear nozzles within an operative distance such that the substrate is dried by the Marangoni drying effect. Alternatively, the first and second linear nozzles can be replaced by a first and second linear array of fan type nozzles. As a further alternative, the drying vapor may be supplied passively, rather than through one or more nozzles.

The inventive nozzle system may be used with a number of conventional or inventive apparatuses to further enhance clean/dry levels and system through-put. In a first embodiment, the inventive apparatus comprises a cleaning fluid tank, a lifting mechanism operatively coupled to the tank for lifting substrates from the tank, a drying vapor source and a rinsing fluid source positioned to supply rinsing fluid to the surface of a substrate as the substrate is lifted from the tank. The rinsing fluid contacts the substrate forming an air/substrate/rinsing fluid interface preferably in the form of a meniscus. The drying vapor source is positioned to supply drying vapor to the air/substrate/rinsing fluid interface, directing drying vapor to a point 1-5 mm above the air/substrate/rinsing fluid interface. Both the rinsing fluid source and the drying vapor source preferably comprise either an array of fan-type nozzles or a single line-type nozzle. However, the drying vapor source may also comprise a passive source such as a vessel filled with the drying fluid positioned along the passage from the rinsing fluid source to the drying chamber so that drying vapors diffuse to the air/substrate/rinsing fluid interface. The rinsing fluid nozzles and the drying fluid nozzles may extend along both the frontside and the backside of the substrate and thereby simultaneously rinse and dry both sides of the substrate.

The active supply of drying vapors via drying vapor nozzles provides tight control over the concentration of drying vapors at the drying meniscus. Unlike other bath-type Marangoni dryers, the present invention provides a continuous supply of fresh rinsing fluid which, unlike the more stagnant bath fluids, has no drying vapors mixed therewith. Thus, the present invention experiences a larger surface tension gradient between the drying meniscus and the remainder of the rinsing fluid flow. The larger surface tension gradient enhances the speed of Marangoni drying. Most significantly, because less fluid is required to spray the entire surface of a substrate than to submerge the substrate, the use of rinsing fluid nozzles significantly reduces fluid consumption as compared to conventional bath-type Marangoni dryers.

In a most preferred embodiment, the throughput of the inventive cleaning/drying system is enhanced via a two-part tank, having a first portion for receiving and cleaning a substrate and a second portion for rinsing a substrate. The first and the second portion of the cleaning tank are in fluid communication. A drying enclosure which encloses the rinsing fluid source and the drying vapor source is operatively coupled above the second portion of the tank, for receiving substrates therefrom.

Preferably, a shuttle which supports a substrate along the outer edges thereof, receives a first substrate in the first portion of the tank and transports the substrate to the second portion of the tank. Thereafter, the lifting mechanism lifts the first substrate into the drying enclosure, and the shuttle returns to the first portion of the tank. In this manner, the first substrate may be dried within the drying enclosure as a second substrate is loaded into the first portion of the cleaning tank, thus providing greater throughput and a corresponding decrease in processing costs.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1A:
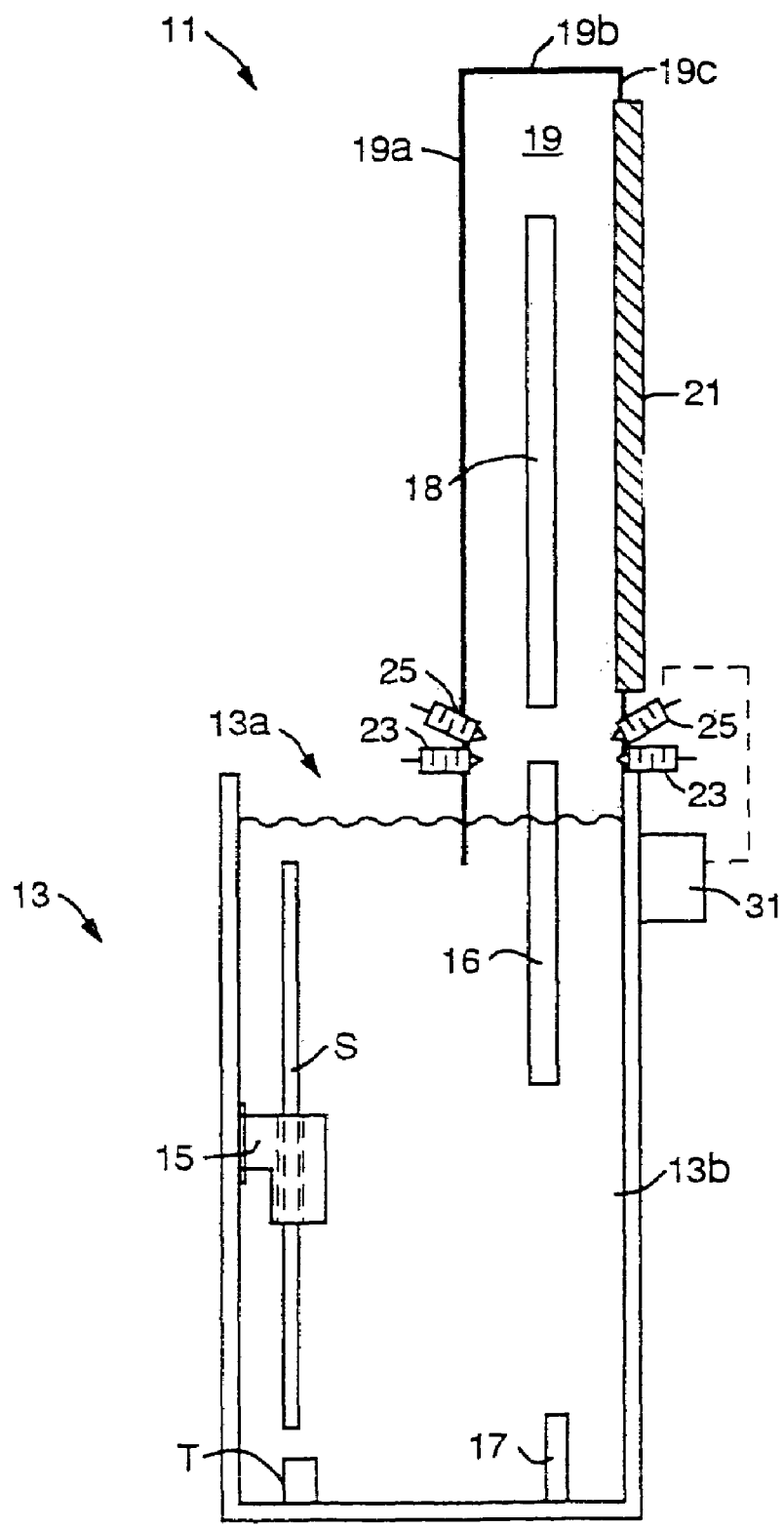
FIG. 1A is a side elevational view of a cleaning/drying system configured in accordance with the present invention.
Figure 1B:
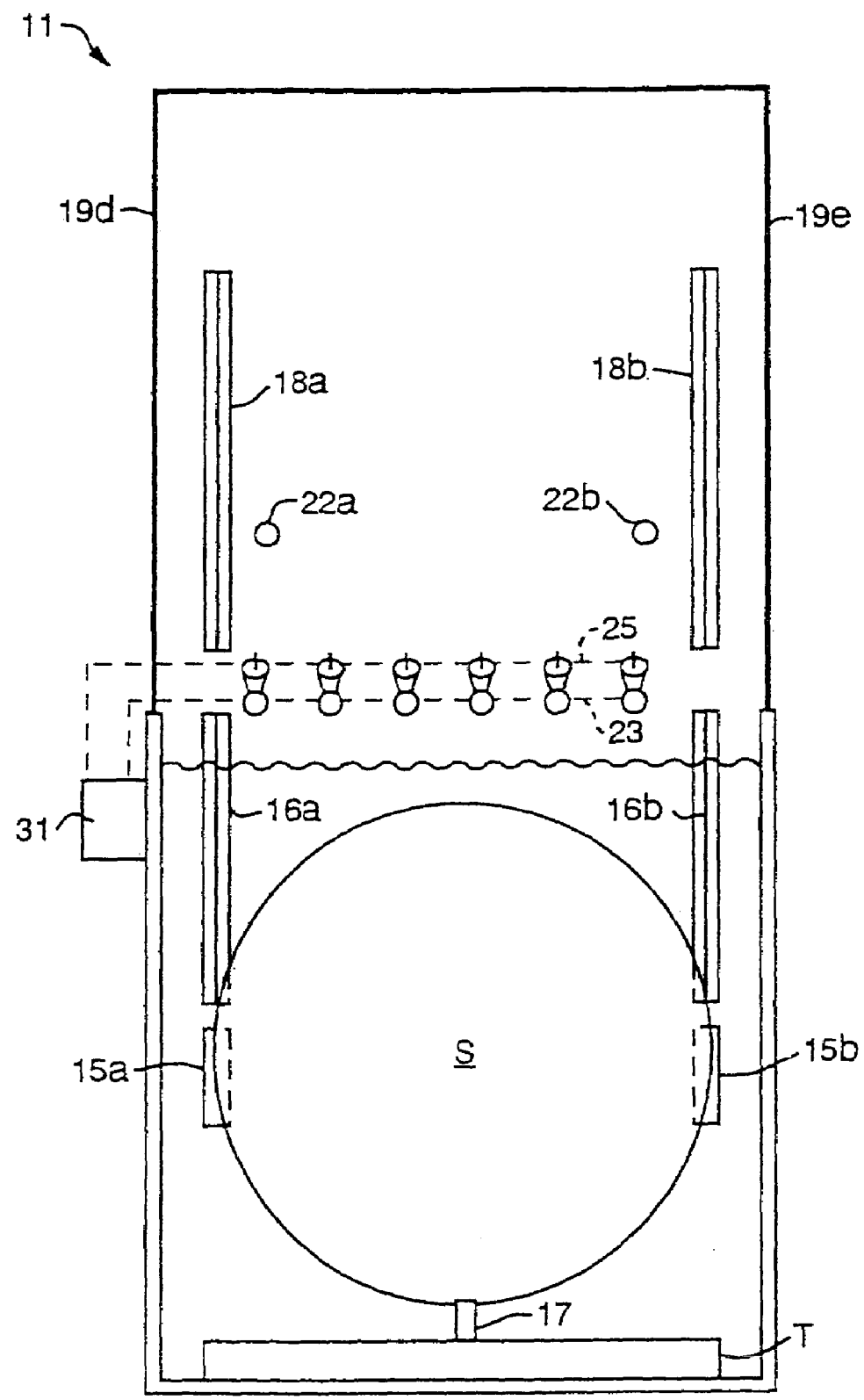
FIG. 1B is a front elevational view of the cleaning/drying system of FIG. 1A.

FIGS. 1A and 1B are a side elevational view and a front elevational view, respectively, of a preferred cleaning/drying system 11 configured in accordance with the present invention. The preferred cleaning/drying system 11 comprises a tank 13 of cleaning fluid. The tank 13 comprises two portions, a substrate receiving and cleaning portion 13a and a substrate rinsing portion 13b. A substrate shuttle 15 is operatively coupled to carry a substrate S from the substrate receiving and cleaning portion 13a to the substrate rinsing portion 13b. The substrate shuttle 15 preferably is designed to support the substrate S vertically along the lateral sides thereof as shown in FIG. 1B. Thus, a lifting mechanism 17 within the substrate rinsing portion 13b of the tank 13 can extend upward between a first and a second supporting sides 15a, 15b of the substrate shuttle 15, lifting the substrate S therebetween.

A first pair of rails 16a, 16b are permanently mounted within the rinsing portion 13b and are positioned to receive the substrate S as the lifting mechanism 17 lifts the substrate S from the first and the second supporting sides 15a, 15b of the substrate support 15. A second pair of rails 18a, 18b are permanently mounted within a drying enclosure 19 and are positioned to receive the substrate S from the first pair of rails 16a, 16b.

The drying enclosure 19 is positioned above the substrate rinsing portion 13b of the tank 13 such that a substrate can be lifted from the substrate rinsing portion 13b into the drying enclosure 19. The drying enclosure 19 is formed by a plurality of walls 19a-e. The outer sidewall 19c has a sealable port 21 through which the substrate S may be extracted. The inner wall 19a of the drying enclosure 19 extends downward so as to be partially submerged in the fluid contained within the tank 13. The drying enclosure 19 is either integral with the tank 13, or is sealingly coupled thereto via the outer sidewall 19c. The walls 19a-e may contain a plurality of holes (not shown) for exhausting residual vapors into an exhaust system (not shown).

Figure 1C:
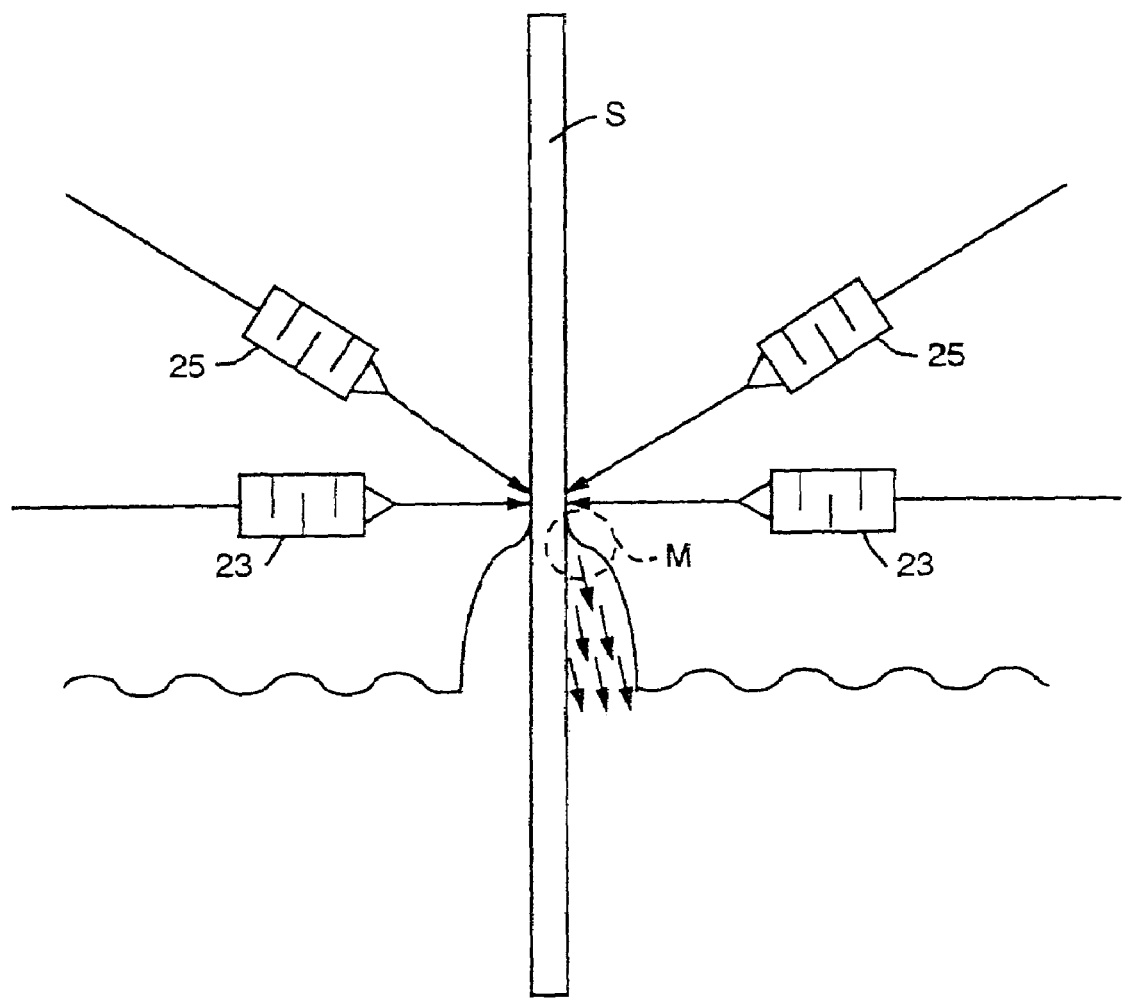
FIG. 1C is a close-up view of a substrate surface, useful in describing the drying operation of the present invention.

Within the drying enclosure 19, a rinsing fluid supply comprising one or more rinsing fluid nozzles 23 is positioned to spray rinsing fluid across the entire horizontal diameter of the substrate S as the substrate S is lifted from the substrate rinsing portion 13b, and a drying vapor supply comprising one or more drying vapor nozzles 25 is positioned to flow drying vapor across the entire horizontal diameter of the substrate S as the substrate S is lifted from the substrate rinsing portion 13b. The drying vapor nozzles 25 preferably are positioned so that the drying vapor will be absorbed by the rinsing fluid at an air/substrate/rinsing fluid interface 27 shown in FIG. 1C. To achieve such absorption, the drying vapor flow preferably strikes the substrate S 1-5 mm above the air/substrate/rinsing fluid interface 27. Also, as shown in FIG. 1C, the air/substrate/rinsing fluid interface 27 preferably forms a meniscus (as enclosed by the dashed circle "M") which facilitates Marangoni drying.

Within the drying enclosure 19, the second pair of rails 18a, 18b is positioned to contact a dry portion (i.e., a portion that has passed through the rinsing fluid and drying vapor sprays) of the substrate S and to thereby receive the substrate S from the lifting mechanism 17. Retractable positioning pins 22a, 22b engage the substrates in the uppermost position, and hold the substrate S in a fixed position so that a wafer handler (not shown) may repeatably remove the substrate S from the drying enclosure 19.

The rinsing fluid nozzles 23 and/or the drying vapor nozzles 25 are coupled to a controller 31, and the controller 31 is programmed to conserve rinsing fluid and/or drying vapor by selectively disengaging the outermost nozzles in the rinsing fluid and/or the drying vapor arrays while the lower half of the substrate S passes thereby. The controller 31 also may be coupled to the lifting mechanism 17, to the positioning pins 22a, 22b, and to the substrate shuttle 15 and is programmed to cause the same to operate as further described with reference to FIGS. 2A-D.

Figure 2A:
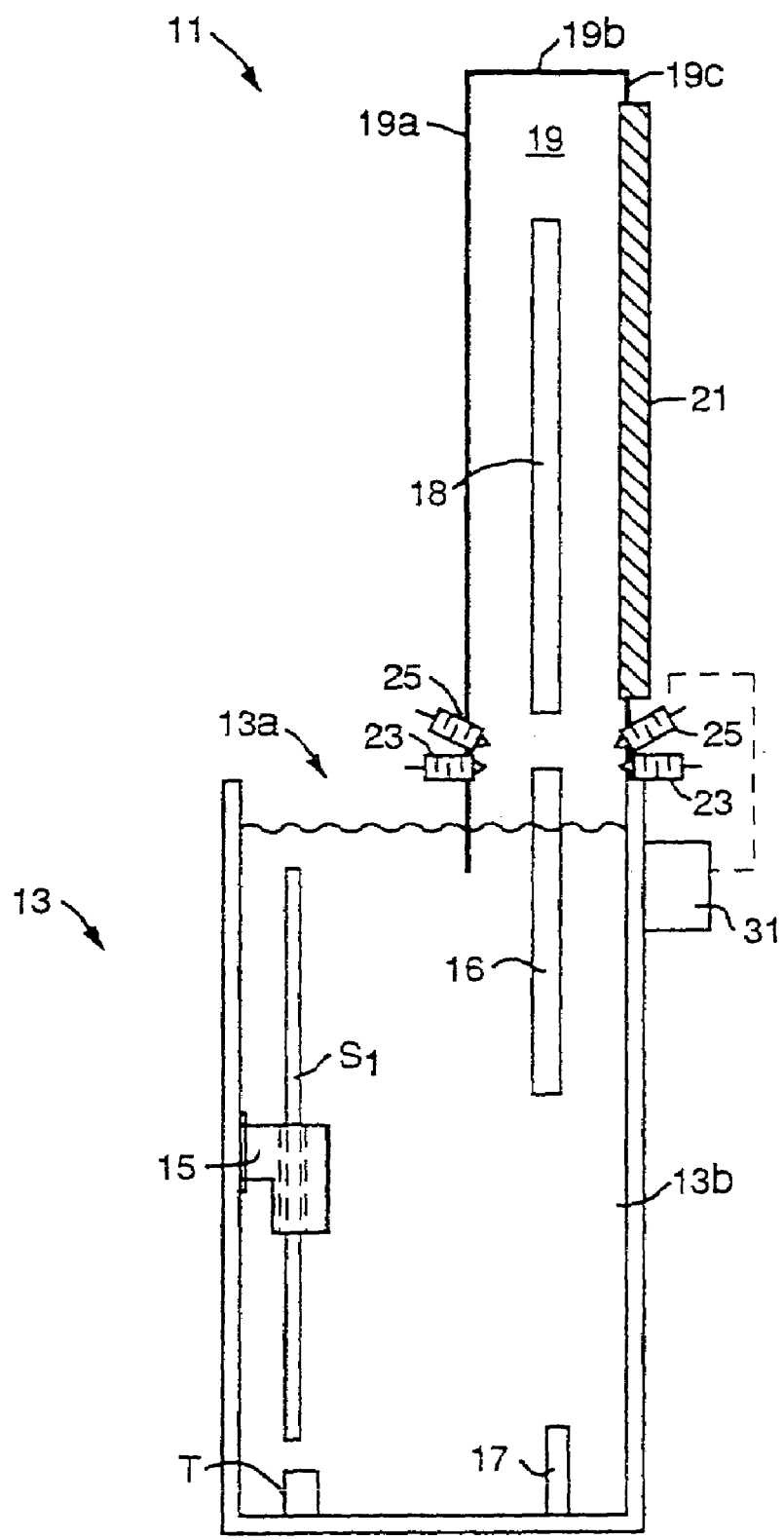
FIGS. 2A-D are sequential side elevational views of the cleaning/drying system of FIGS. 1A and 1B, useful in describing the increased throughput of the present invention.

FIGS. 2A-D are sequential side elevational views of the preferred cleaning/drying system 11 of FIG. 1, which are useful in describing the operation of the inventive cleaning/drying system 11 and the increased throughput achieved thereby. As shown in FIG. 2A, the substrate shuttle 15 is initially in a retracted position within the substrate receiving and cleaning portion 13a of the tank 13, and a substrate S is lowered into the substrate shuttle 15 via a wafer handler (not shown).

Figure 2B:
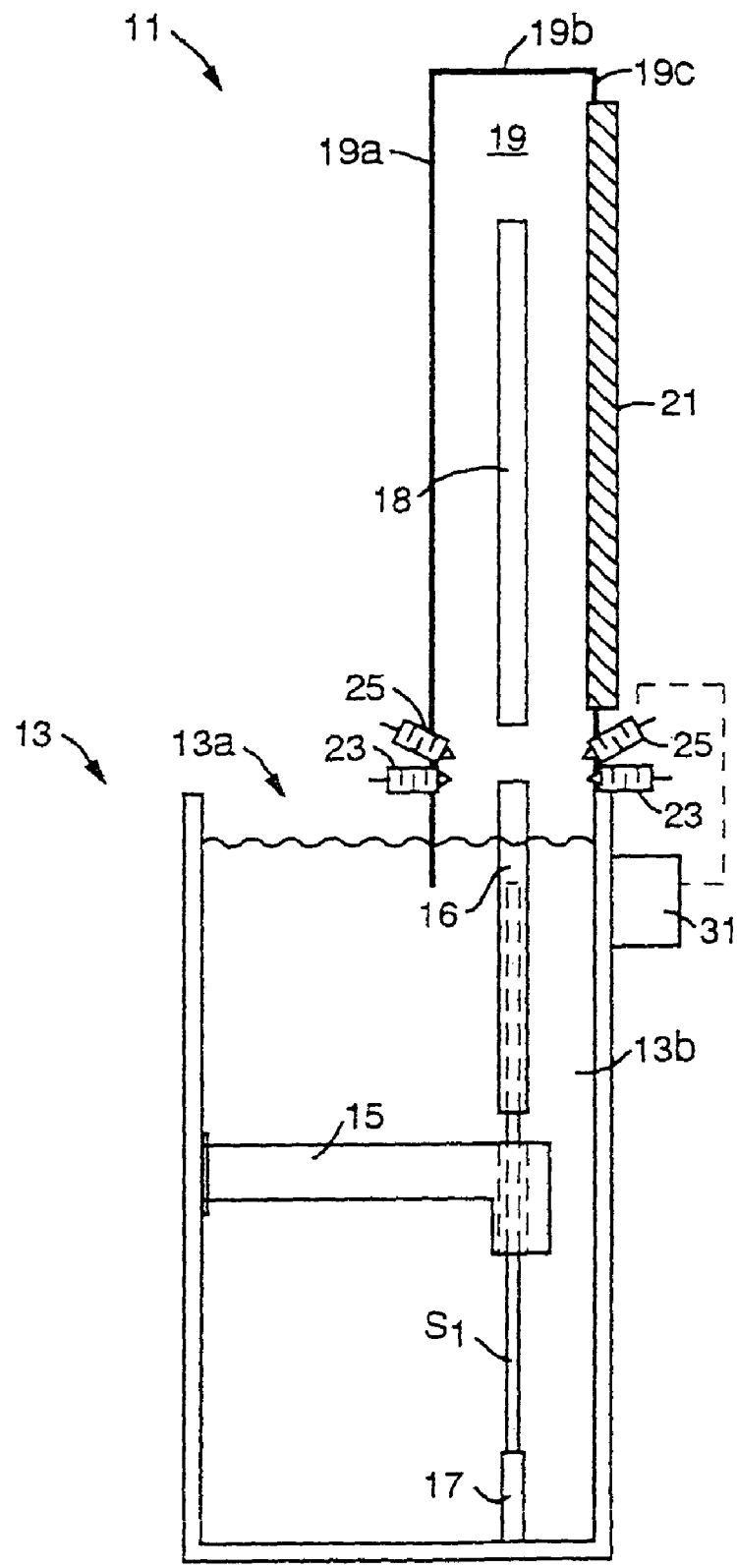

The substrate S is megasonically cleaned within the substrate receiving and cleaning portion 13a via megasonic energy emitted from one or more transducers T positioned within the substrate receiving and cleaning portion 13a. To facilitate even cleaning across the entire surface of the substrate S, the substrate S may be rotated via rollers (not shown). After the substrate S is clean, the substrate shuttle 15 extends, carrying the substrate S into the substrate rinsing portion 13b of the tank 13 as shown in FIG. 2B.

Figure 2C:
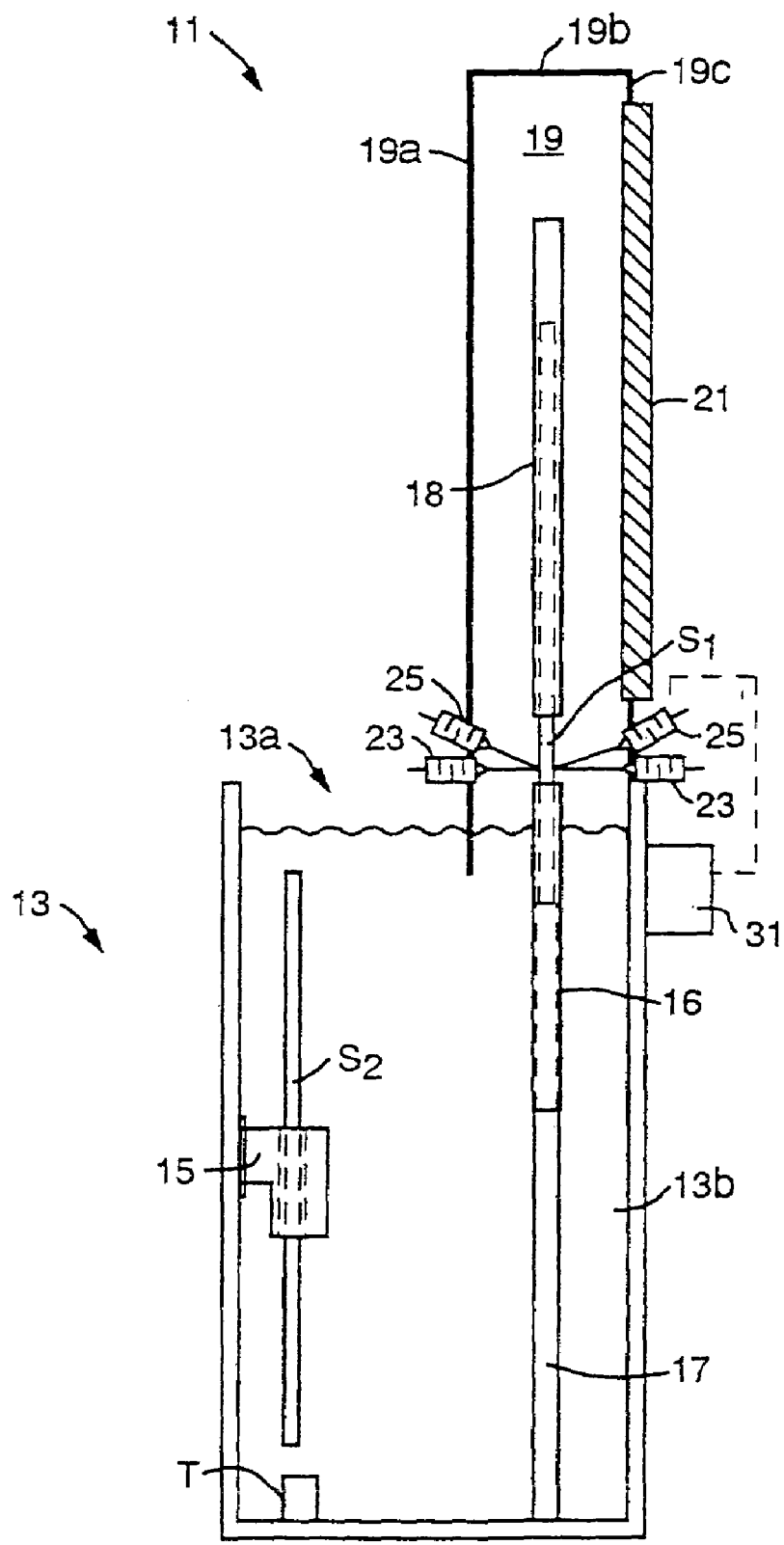

The lifting mechanism 17 elevates, contacting the lower edge of the substrate S and slowly lifting the substrate S from the fluid (FIG. 2C). The substrate S preferably is lifted at a speed less than or equal to the vertical velocity component of rinsing fluid flowing out of the tip of the meniscus M.

As the substrate S reaches the top of the tank fluid, the rinsing fluid nozzles 23 are engaged and begin to spray rinsing fluid such that the substrate S is contacted with rinsing fluid immediately as it is lifted from the bath and thus does not dry (e.g., via evaporation) prior to reaching the drying vapor nozzles 25. The flow rate of the rinsing fluid spray is controlled to prevent rinsing fluid from splashing into or above the drying vapor spray.

As soon as the substrate S intersects the rinsing fluid sprays from the rinsing fluid nozzles 23, the drying vapor nozzles 25 are engaged and direct a drying vapor flow to the rinsing fluid meniscus M which forms on the surface of the substrate S. The drying vapors are absorbed by the rinsing fluid, which lowers the surface tension of the rinsing fluid and induces a Marangoni flow from the meniscus toward the bulk of the rinsing fluid. The Marangoni flow thereby dries the substrate's surface leaving the surface free of streaks, spotting and/or cleaning fluid residue.

As the lifting mechanism 17 lifts the substrate S into the drying enclosure 19, the first and second supporting sides 15a, 15b of the substrate shuttle 15 followed by the first pair of rails 16a, 16b provide stabilizing contact along the edges of the substrate S. After the substrate S disengages supporting sides 15a, 15b of the shuttle 15, the shuttle is returned to the receiving and cleaning portion 13a of the tank 13 and is ready to receive and clean the next substrate. The first pair of rails 16a, 16b support the substrate S below the air/substrate/rinsing fluid interface 27. The dry part of the substrate S is guided and supported by the second pair of rails 18a, 18b as the substrate S enters the drying enclosure 19. The gap between the first pair of rails 16a, 16b and the second pair of rails 18a, 18b is sufficient to accommodate the rinsing fluid nozzles 23 and the drying vapor nozzles 25, such that the substrate is dry when it encounters the second pair of rails 18a, 18b (e.g., 5-10 mm.) The lifting mechanism 17 continues to lift the substrate S until the bottom portion thereof has passed through the drying meniscus M (FIG. 2C). When the substrate S is 3-5 mm above the positioning pins 22a, 22b, controller 31 releases the positioning pins 22a, 22b. The lifting mechanism 17 retracts, the substrate S lowers therewith until the substrate is supported by the positioning pins 22a, 22b, the rinsing fluid spray stops and residual rinsing fluid is driven off the substrate S's surface by the combined surface tension gradient and by a pulse of hot nitrogen which is applied to the bottom 3 mm of the substrate via a nozzle (not shown) for 1-2 seconds. Afterwards, the substrate S is unloaded from the drying enclosure 19 via the sealable port 21. The positioning pins 22a, 22b fix the Z-axis coordinate of the substrate S at a known position such that an unloading robot (not shown) may repeatably extract the substrate S.

As the substrate is rinsed and dried the rinsing fluid flows from the substrate into the tank 13, where it joins the tank fluid and overflows into overflow weirs (not shown). The rinsing fluid also could be continuously introduced from the bottom of the tank 13 and may be recirculated through a heater and filter.

Figure 2D:
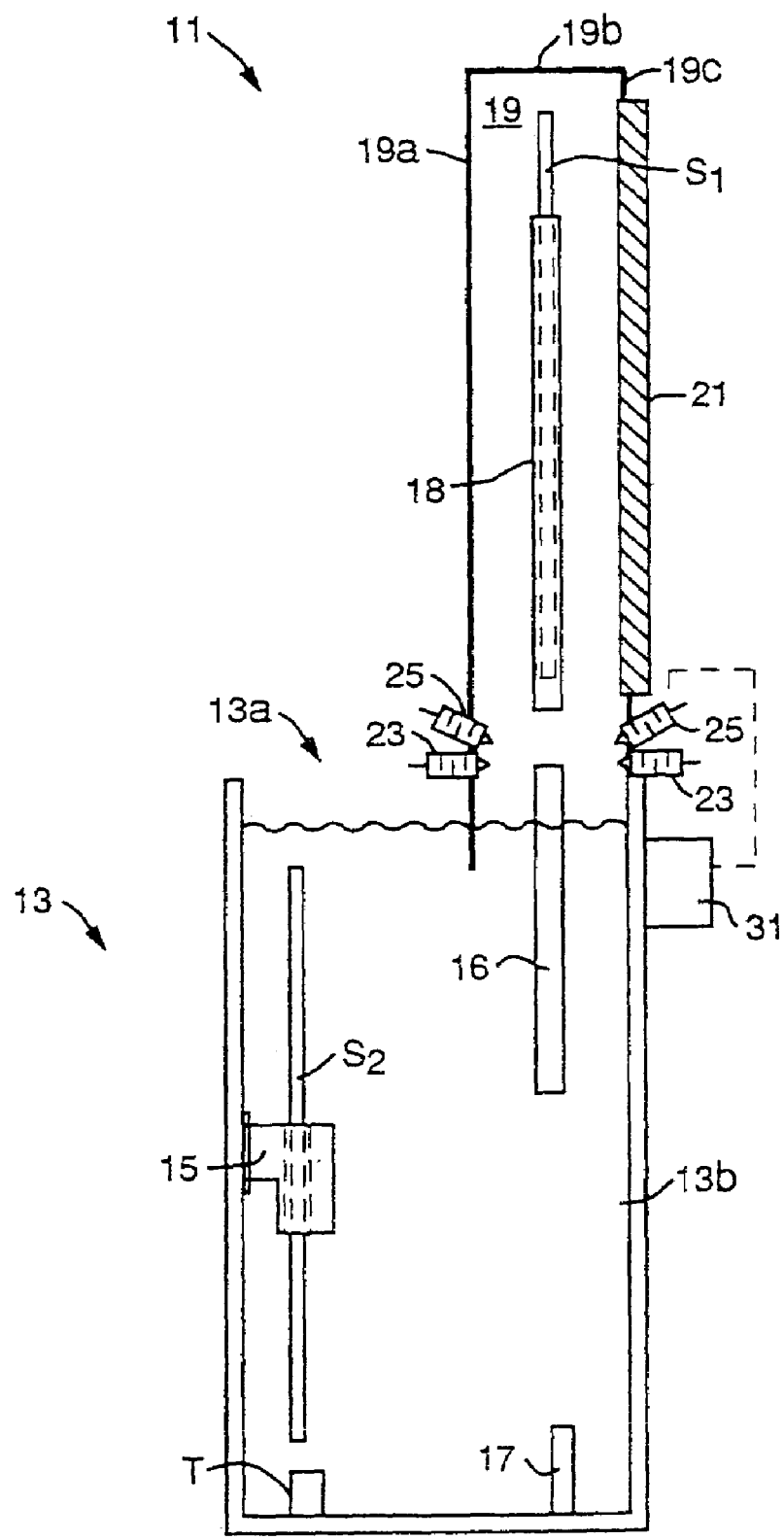

As shown in FIG. 2D, during the time in which the substrate S is lifted into the first pair of rails 16a, 16b, the substrate shuttle 15 retracts into the substrate receiving and cleaning portion 13a and a second substrate $S_2$ is loaded into the substrate shuttle 15 via a wafer handler (not shown). Thereafter, the second substrate $S_2$ is megasonically cleaned while the first substrate $S_1$ is being rinsed and dried until the lifting mechanism 17 retracts. If cleaning and rinsing in the receiving and cleaning portion 13a is complete, substrate $S_2$ is ready to be shuttled to the substrate rinsing portion 13b, while the first substrate $S_1$ is unloaded from the drying enclosure 19 via the sealable port 21. In this manner the throughput of the inventive cleaning/drying system 11 is increased, as the load and unload time required of conventional tank systems overlaps with the time required for processing (cleaning, rinsing and drying).

The foregoing description discloses only the preferred embodiments of the invention, modifications of the above disclosed apparatus and method which fall within the scope of the invention will be readily apparent to those of ordinary skill in the art. For instance, although an inventive two part tank having a drying enclosure positioned thereabove is preferred, the inventive cleaning, rinsing and drying method may be performed with use of a conventional tank, and may be performed with or without the drying enclosure.

The cleaning fluid may comprise SC1, deionized water, or a ph adjusted solution for surface cleaning, etc. The rinsing fluid contained in the tank or sprayed through the nozzles may comprise deionized water with or without a corrosion inhibitor or other solvents, etc., and the drying vapor may comprise any vapor which exhibits low surface tension when condensed or absorbed on the rinsing fluid surface (IPA, etc.). If the cleaning fluid differs from the rinsing fluid, the receiving and cleaning portion 13a would be sealably separated from the rinsing portion 13b by a sealable gate and the cleaning fluid would be drained into a storage vessel (not shown) and the receiving and cleaning portion 13a filled with rinsing fluid before opening the gate. Although less preferred, the transducers may be omitted, such that only rinsing and drying is performed or the transducers may be employed in the second portion 13b of the tank. The transducers, although shown positioned along the bottom of the tank, may be positioned at other locations. Finally, the shuttle and lifting mechanisms described are merely exemplary; other such mechanisms will be readily apparent to those of ordinary skill in the art.

Accordingly, while the present invention has been disclosed in connection with the preferred embodiments thereof, it should be understood that other embodiments may fall within the spirit and scope of the invention, as defined by the following claims.

The invention claimed is:

1. An apparatus for rinsing and drying a substrate comprising:
   a tank of cleaning fluid, for submerging a substrate, the tank comprising a first portion for receiving and cleaning the substrate and a second portion, operatively coupled to the first portion, for rinsing the substrate, the first and the second portions being horizontally adjacent;

a lifting mechanism operatively coupled to the tank for lifting a substrate from the cleaning fluid;

a drying vapor source positioned to supply drying vapor to an air/substrate/fluid interface formed as the substrate is lifted from the second portion of the tank by the lifting mechanism; and a substrate shuttle operatively coupled within the tank for receiving the substrate within the first portion and for shuttling the substrate directly to the second portion without removing the substrate from the tank.

2. The apparatus of claim 1, wherein the apparatus further comprises a drying enclosure operatively coupled above the second portion of the tank for receiving substrates therefrom, wherein the drying enclosure encloses the drying vapor source.

3. The apparatus of claim 2 further comprising:

a lifting mechanism for lifting a substrate from the substrate shuttle to the drying enclosure.

4. The apparatus of claim 2 further comprising a mechanism adapted to hold the wafer in a fixed position relative to the drying enclosure.

5. The apparatus of claim 2 wherein the drying enclosure further comprises a side wall having a sealable opening for substrate extraction.

6. The apparatus of claim 1 wherein the first portion of the tank comprises a transducer adapted to sonically clean the substrate.

7. The apparatus of claim 2 wherein the first portion of the tank comprises a transducer adapted to sonically clean the substrate.

8. The apparatus of claim 3 wherein the first portion of the tank comprises a transducer adapted to sonically clean the substrate.

9. The apparatus of claim 4 wherein the first portion of the tank comprises a transducer adapted to sonically clean the substrate.

10. The apparatus of claim 5 wherein the first portion of the tank comprises a transducer adapted to sonically clean the substrate.

11. An apparatus for rinsing and drying a substrate, comprising:

a tank of fluid, for at least partially submerging a substrate, the tank comprising a first portion for receiving the substrate and a second portion that is horizontally adjacent the first portion, wherein the first portion is operatively coupled to the second portion such that the substrate may be passed directly from the first portion to the second portion without being removed from the tank;

a lift mechanism for lifting the substrate from the second portion of the tank; and a drying vapor source positioned to supply drying vapors to an air/substrate/fluid interface formed as the substrate is lifted from the second portion of the tank by the lifting mechanism.

12. The apparatus of claim 11 wherein the first portion of the tank comprises a transducer adapted to sonically clean a substrate.

13. The apparatus of claim 11, further comprising a substrate shuttle operatively coupled within the tank for receiving the substrate within the first portion and for shuttling the substrate to the second portion.

14. The apparatus of claim 11, wherein the substrate is a vertically oriented substrate.

15. The apparatus of claim 1, wherein the substrate is a vertically oriented substrate.

* * * * *